United States Patent [19]

Bhatia et al.

[11] Patent Number: 4,535,531

[45] Date of Patent: * Aug. 20, 1985

[54] METHOD AND RESULTING STRUCTURE FOR SELECTIVE MULTIPLE BASE WIDTH TRANSISTOR STRUCTURES

[75] Inventors: Harsaran S. Bhatia, Wappingers Falls; Jack A. Dorler, Poughkeepsie; Santosh P. Gaur; John S. Lechaton, both of Wappingers Falls; Joseph M. Mosley, Hopewell Junction; Gurumakonda R. Srinivasan, Poughkeepsie, all of N.Y.

[73] Assignee: International Business Machines Corporation, Armonk, N.Y.

[*] Notice: The portion of the term of this patent subsequent to Mar. 13, 2001 has been disclaimed.

[21] Appl. No.: 360,730

[22] Filed: Mar. 22, 1982

[51] Int. Cl.³ .................... H10L 21/302; H10L 21/22
[52] U.S. Cl. .................................. 29/577 C; 29/571; 29/578; 29/576 E; 29/576 W; 29/580; 148/175; 148/187; 148/1.5; 156/643; 156/653; 156/627; 357/34; 357/48; 357/59; 357/55
[58] Field of Search ............ 29/577 C, 576 E, 576 W, 29/578, 580, 571; 148/175, 187, 1.5; 156/643, 653, 657, 662, 626, 627; 357/20, 34, 40, 47, 48, 59, 50, 55

[56] References Cited

U.S. PATENT DOCUMENTS

| | | | |
|---|---|---|---|
| 3,312,881 | 4/1967 | Yu | 317/235 |
| 3,335,341 | 8/1967 | Lin | 317/235 |
| 3,489,622 | 1/1970 | Barson et al. | 148/187 |
| 3,551,220 | 12/1970 | Meer et al. | 148/175 |
| 3,566,218 | 2/1971 | Widlar et al. | 317/235 |
| 3,669,760 | 6/1972 | Rein et al. | 148/1.5 |
| 3,677,837 | 7/1972 | Ashar | 148/175 |
| 3,717,515 | 2/1973 | Ashar et al. | 148/175 |
| 3,810,123 | 5/1974 | Baitinger | 340/173 FF |
| 3,926,695 | 12/1975 | U | 148/187 |
| 3,966,577 | 6/1976 | Hochberg | 204/192 |
| 3,969,748 | 7/1976 | Horie et al. | 357/46 |
| 4,030,954 | 6/1977 | Horie | 156/628 |
| 4,045,784 | 8/1977 | Mayumi et al. | 340/173 SP |
| 4,104,086 | 8/1978 | Bondur et al. | 148/1.5 |
| 4,139,442 | 2/1979 | Bondur et al. | 204/192 E |
| 4,224,088 | 9/1980 | Komatsu et al. | 148/187 |
| 4,306,916 | 12/1981 | Wollesen et al. | 29/571 X |
| 4,416,055 | 11/1983 | McCarthy et al. | 29/577 C |
| 4,420,872 | 12/1983 | Solo de Zaldivar | 29/577 C X |
| 4,435,898 | 3/1984 | Gaur et al. | 29/577 C |

OTHER PUBLICATIONS

IBM Technical Disclosure Bulletin, vol. 20, No. 4, Sep. 1977, "High-Performance Transistor Structure", by K. Malin, pp. 1495-1496.

Primary Examiner—Brian E. Hearn
Assistant Examiner—David A. Hey
Attorney, Agent, or Firm—T. Rao Coca; George O. Saile

[57] ABSTRACT

A process is described which permits the fabrication of very narrow base width bipolar transistors in selected areas of an integrated circuit chip and bipolar transistors of wider base width on other selected areas of the same integrated circuit chip. The ability to selectively vary the transistor characteristics from one region of an integrated circuit chip to another provides a degree of freedom for design of integrated circuits which is valuable. The bipolar transistors on an integrated circuit chip are processed up to the point of emitter formation using conventional techniques. But, prior to the emitter formation, the base area which is to be the emitters of the selected region having the very narrow base transistors is dry etched using reactive ion etching. The existing silicon nitride/silicon dioxide layers with the emitter opening therein are used as the etching mask for this reactive ion etching procedure. Once the etching is completed to the desired depth, the normal processing is resumed to form the emitter and rest of the metallization.

15 Claims, 6 Drawing Figures

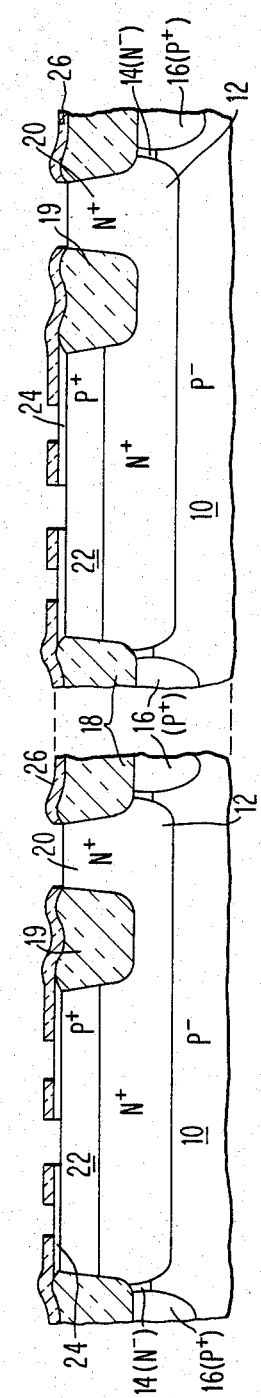
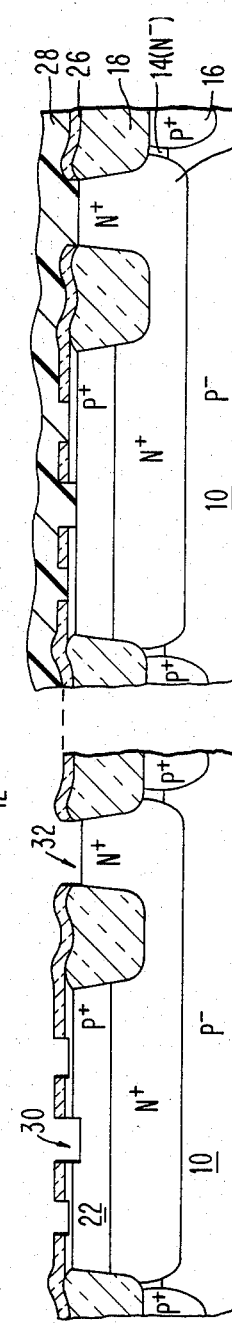
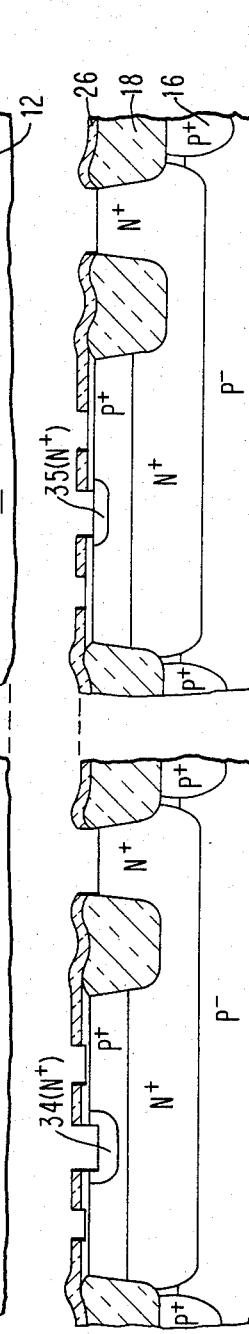
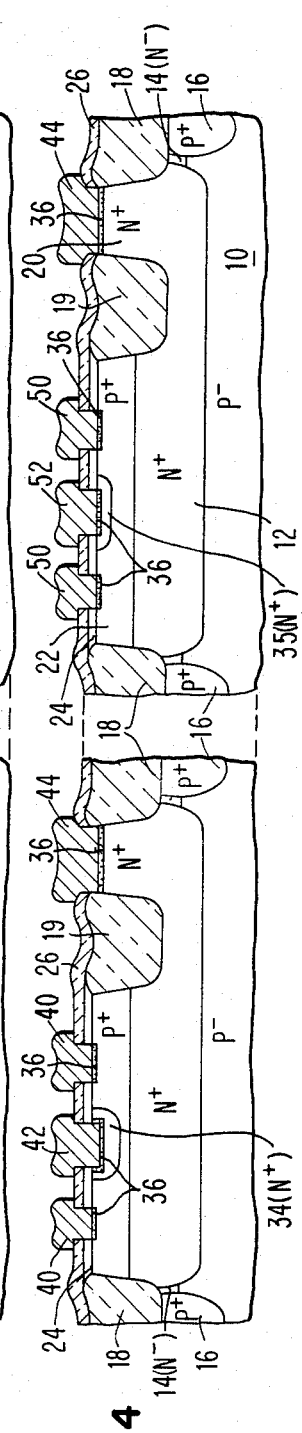
FIG.1
FIG.2
FIG.3
FIG.4

METHOD AND RESULTING STRUCTURE FOR SELECTIVE MULTIPLE BASE WIDTH TRANSISTOR STRUCTURES

DESCRIPTION

Technical Field

The invention relates to methods and resulting structures for selectivity in the performance of internal and peripheral or external circuit in an integrated circuit and more particularly the selective fabrication of bipolar transistors of at least two different bases on an integrated circuit chip.

CROSS-REFERENCE TO RELATED PATENT APPLICATIONS

Pat. application Ser. No. 360,731, filed like date, entitled "Method for Making a Base Etched Transistor Integrated Circuit" by S. P. Gaur et al. now U.S. Pat. No. 4,435,898.

BACKGROUND ART

In bipolar integrated circuits, chip performance depends not only on the internal circuits, but also on the peripherals or external circuits, such as drivers and receivers, which communicate to off chip circuits. However, for optimum performance, it is desirable to have the internal circuits operating at higher speeds and at higher gains than those in the peripherals.

These improvements to performance ($Y_e$) and gain ($h_{FE}$) for the internal circuits cannot be at the expense of other critical parameters for the external circuits, such as the breakdown voltage between the emitter and collector, BVCEO, current handling capabilities, etc. This would ensure faster internal circuits while maintaining the necessary package compatibility in terms of wiring rules, delay equations and noise criteria. This type of discriminatory operation of internal circuits versus external circuits has not been practical.

Among the most important parameters that affect the delay in bipolar transistors is the base profile in the intrinsic device region. The device can be made faster by decreasing the base width. This can be accomplished by either a shallow base diffusion or by a deeper emitter. However, the problem with either of the above approaches is that, in the past, it was not simple to achieve different basewidths on different areas of the chip, without resorting to a complicated sequence of heat cycles and process steps, such as described in H. C. Lin U.S. Pat. No. 3,335,341; R. J. Widlar U.S. Pat. No. 3,566,218; U. G. Baitinger et al. U.S. Pat. No. 3,810,123; N. Horie et al. U.S. Pat. No. 3,969,748; H. Mayumi et al. U.S. Pat. No. 4,045,784; or Komatsu et al. U.S. Pat. No. 4,224,088.

It is known that thin base regions are very desirable for high performance bipolar transistor devices which have very high operating speeds and amplification characteristics. There have been methods proposed for producing such very narrow base regions over the years. Of the methods that have been used, diffusion, and ion implantation with or without the combined use of etching have been used to produce narrow base region devices.

One line of patents which have worked toward the narrow base structure involves what is called the pedestal transistor. The patents required accurately controlling junction depths, epitaxial layer thicknesses, surface uniformity, and quality to form these devices of small geometry. Examples of this technology is the H. N. Yu U.S. Pat. No. 3,312,881; F. Barson et al. U.S. Pat. No. 3,489,622; K. G. Ashar U.S.Pat. No. 3,677,837 and K. G. Ashar et al. U.S. Pat. No. 3,717,515. Each of these patents attempt to control the narrow base width through various diffusion techniques and in no way utilize the etching technique of the present invention.

Another series of patents and publications utilize the etching technique for removal of portions of the base region followed by the emitter diffusion. The examples of this technology is the W. Meer et al. U.S. Pat. No. 3,551,220; Hans-Martin Rein et al. U.S. Pat. No. 3,669,760; Aung San U U.S. Pat. No. 3,926,695; N. Horie U.S. Pat. No. 4,030,954 and K. Malin IBM Technical Disclosure Bulletin, Vol. 20, No. 4, September 1977, pages 1495-1496. While these publications do describe etching, they all describe a chemical etching technique which produces the undercutting of the etching mask within the base region. This chemical etching process cannot be well controlled and the etching solution introduces unwanted impurities into the small dimensioned geometries that workers in the field desire in the very large scale integration technology.

Plasma or reactive ion etching is a technique which has been developed for etching metals, semiconductor materials and dielectrics in the manufacture of integrated circuit devices. In particular, the method of reactive ion etching which is capable of doing anisotropic etching wherein very high aspect ratios is obtainable. High aspect ratio means, in this context, the ratio of vertical etching is much greater than the horizontal etching. The process involves the use of a plasma or ionized gas containing a variety of highly reactive material, such as ions, free electrons, and free radicals. The plasma used in etching may be maintained at relatively low temperatures and pressures in the range of less than about 20 Torr. The process has been used to etch depressions in silicon semiconductor bodies for a variety of reasons, such as shown in the A. K. Hochberg U.S. Pat. No. 3,966,577 issued June 29, 1976; J. A. Bondur et al. U.S Pat. No. 4,104,086 and J. A. Bondur et al. U.S. Pat. No. 4,139,442. However, there is no suggestion or understanding of the need in any of these patents of the use of the reactive ion etching technique for making very narrow base bipolar transistor structures.

SUMMARY OF THE PRESENT INVENTION

In accordance with the present invention a process is described which permits the fabrication of very narrow base width bipolar transistors in selected areas of an integrated circuit chip and bipolar transistors of wider base width on other selected areas of the same integrated circuit chip. The ability to selectively vary the transistor characteristics fron one region of an integrated circuit chip to another provides a degree of freedom for design of integrated circuits which is valuable. The bipolar transistors on an integrated circuit chip are processed up to the point of emitter formation using conventional techniques. But, prior to the emitter formation, the base area which is to be the emitters of the selected region having the very narrow base transistors is dry etched using reactive ion etching. The existing silicon nitride/silicon dioxide layers with the emitter opening therein are used as the etching mask for this reactive ion etching procedure. Once the etching is completed to the desired depth, the normal processing is resumed to form the emitter and rest of the metallization. Since the intrinsic base under the emitter is etched, and the normal emitter is formed afterwards, the etching reduces the base width by an amount approximately equal to the etched depth. The transistor characteristics depend strongly upon the base width under most circumstances. It is therefore necessary to control the etching to very tight dimensions. In prior techniques the problem involved was the reproducibility of etching depths. The present invention is based upon the ability to very accurately control the etching depth in the selected regions while blocking the etching in the unselected regions. This is done by using the particular reactive ion etching process in conjunction with an in situ polycrystalline silicon thickness monitor together with a laser interferometer.

Specifically, the method for forming an integrated circuit having two bipolar transistor types, each having different operating speeds and amplification characteristics in an integrated circuit involves first providing a monocrystalline silicon substrate having a pattern of regions of the monocrystalline silicon isolated from one another by a dielectric isolation pattern on one major surface of the substrate. A subcollector region is provided within the monocrystalline silicon and spaced from that major surface. A base region in at least certain of the regions of silicon is formed down to the subcollector region wherein the base region has a surface concentration of more than about $1 \times 10^{18}$ atoms/cc and the collectorbase junction depth is between about 800 to 850 nanometers in depth. A block-out mask is formed over the major surface in regions where the transistor type of lower characteristics are desired. A depression is formed in the base region in areas uncovered by said block-out mask by a precise reactive ion etching process to a depth of about 70 to 100 nanometers. The depression is formed in that portion of base region wherein an emitter region is planned to be formed. The block-out mask is removed. An emitter region is then formed in this etched portion of the base region as well as the unetched emitter regions by diffusion or ion implantation and a heating cycle wherein intrinsic base regions are formed of different base widths. The appropriate contacts are then made to each of the elements of the bipolar transistors.

BRIEF DESCRIPTION OF THE DRAWINGS

The drawings show the following:

FIGS. 1 through 4 are schematic greatly enlarged vertical illustrations for the method of one embodiment for making two bipolar transistor types each having different operating speeds and amplification characteristics.

DISCLOSURE OF THE INVENTION

Figure 5:
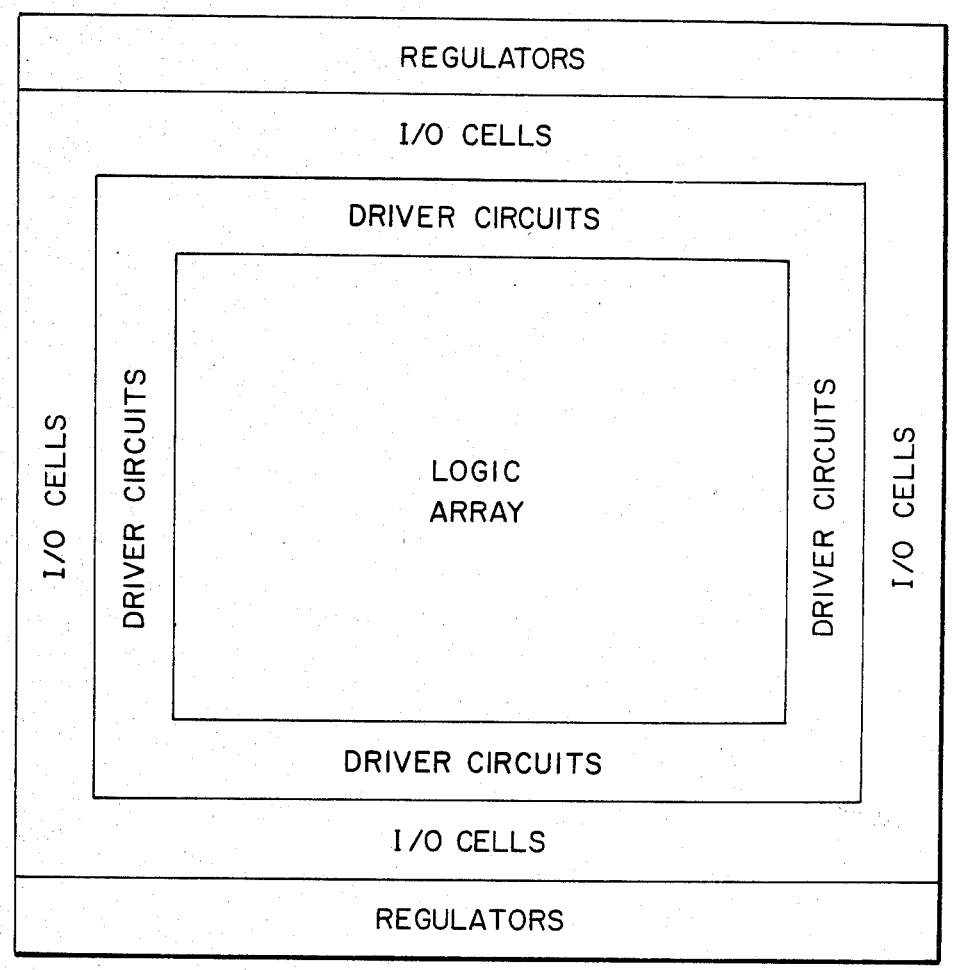
FIG. 5 schematically illustrates an integrated circuit chip layout for a logic array organized according to the teachings of the present invention.

Referring now more particularly to FIG. 1 there is illustrated an embodiment for forming two NPN bipolar transistor types upon the same integrated circuit chip. The FIG. 1 illustrates one small, greatly enlarged portion of the silicon body which will be used to form a very dense, high performance bipolar integrated circuit. The break between the two device areas is intended to show some distance between the two represented devices. A P− substrate of monocrystalline silicon 10 has a N+ subcollector region 12 therein. An epitaxial N− layer is then grown on top of the substrate 10. These processes are standard processes in the formation of, for example, NPN bipolar transistors. The substrate is typically a <100> crystallographic orientation silicon wafer having a resistance of about 10 to 20 ohm/cm. Subcollector diffusion is typically formed using arsenic having a surface concentration of about $1 \times 10^{20}$ atoms/cm$^3$. The epitaxial growth process to form layer 14 may be by conventional techniques, such as the use of silicon tetrachloride/hydrogen or silane/hydrogen mixtures at temperatures of between about 1000° C. to 1200° C. During the epitaxial growth the dopant in the N+ layer moves into the epitaxial layer to fully form the subcollector region 12 as illustrated in FIG. 1. The thickness of the epitaxial layer for highly dense integrated circuits is of the order of 3 micrometers or less. P+ regions 16 can also be formed in the substrate 10 in the designated areas under the recessed silicon dioxide isolating regions 18 which are to be formed. These P+ regions prevent surface inversion and current leakage. A mask, such as a thermally grown silicon dioxide layer (not shown) is formed on the surface of the epitaxial layer 14 and by suitable lithography and etching techniques mask openings are formed therein.

The next series of steps in this embodiment involve the formation of isolation regions of monocrystalline silicon from other regions of monocrystalline silicon. The isolation may be back-biased PN junctions, partial dielectric isolation or complete dielectric isolation. The dielectric materials used may be silicon dioxide, glass, etc. The preferred isolation for highly dense integrated circuits is dielectric isolation. FIG. 1 shows partial dielectric isolation with dielectric regions 18 together with the P+ region 16 isolating monocyrstalline silicon regions of the silicon body from one another and region 19 which isolates the base-emitter region from the collector reachthrough region. There are many ways in the art to form dielectric isolation regions of this type. It is preferred to use the process described in the Magdo et al. Pat. application Ser. No. 150,609 filed June 7, 1971 or Peltzer U.S. Pat. No. 3,648,125. Alternately, the process described in the J. A. Bondur et al. U.S. Pat. No. 4,104,086 can be used. In that patent application and patents the processes for forming partial dielectric isolation for the regions 18 and 19 are described in detail.

The N+ collector reach-through region 20 to subcollector region 12 is formed using standard lithography, etching and diffusion or ion implantation techniques. The region 20 is typically formed with a phosphorus or arsenic dopant.

The P+ base region 22 is formed at this time using silicon dioxide masking with standard lithography, etching and diffusion or ion implantation techniques. It is preferred that the base region butt dielectric isolations 18 and 19, as shown in FIG. 1. The masking lithography layers are then removed. A first insulating layer of silicon dioxide 24 is preferably thermally grown is formed over the exposed silicon regions. A chemical vapor deposited silicon nitride region 26 is formed over the entire surface of the silicon body as shown in FIG. 1. This insulating combination layer may alternatively be one or a combination of known insulating materials, such as silicon dioxide, silicon nitride, aluminum oxide, or the like, in addition to the thermally grown silicon dioxide. The silicon dioxide layer 24 may be thermally grown in an oxygen or oxygen-water vapor ambient at a temperature of about 925° C. A second method for growing silicon dioxide involves the use of chemical vapor deposition process wherein silane and oxygen are used in the ambient at about 450° C. The silicon nitride layer is formed by chemical vapor deposition usually under the following conditions: Silane, ammonia and nitrogen carrier gas at a temperature of about 800° C. under atmospheric or a low pressure conditions as discussed in more detail in the V. Y. Doo U.S. Pat. No. 4,089,992.

The surface concentration of the base region formed is required to be more than about $1 \times 10^{18}$ atoms/cc and preferably about $5 \times 10^{18}$ atoms/cm$^3$. This base region with this conductivity may be formed using either diffusion or ion implantation. The preferred diffusion process uses BBr$_3$ at 875° C. for about 45 minutes followed by a base oxidation of thickness 80±10 nanometers to drive the base into a depth of 0.5 μm. The ion implant conditions are chosen to produce a similar base profile after oxidation and drive-in. The BBr$_3$ process is preferred over ion implantation process because of reduced damage.

The collector-base junction depth is adjusted to give a final value of 800–850 nanometers for an emitter depth of 450–500 nanometers used in this example. These values are for illustration purposes only and can be suitably altered by one skilled in the art to provide base widths of the order of 100 to 400 nanometers. The collector-base junction depth could vary between, for example, about 500 to 900 nanometers. The exact specification of the junction depths is dictated by the required circuit performance. However, if the emitter is thinner than about 200 nanometers, the current gain is reduced due to heavy doping effects in the emitter. On the other hand, if the emitter is too deep, such as greater than about 500 nanometers, the device speed is reduced due to increased charge storage in the emitter.

Using conventional lithography and etching techniques the contact openings for the base and the emitter opening and collector contact opening are made in the silicon nitride layer 26. Through further lithography and etching techniques the emitter and collector reach-through regions are opened to the monocrystalline silicon through the silicon dioxide layer 24 resulting in the FIG. 1 structure.

A block-out mask 28 is formed over the transistor regions where slower operating speeds and lower amplification is desired. The mask is formed using any conventional photoresist. The photoresist is spun onto the wafer to a thickness of about 1 micrometer and baked. The resist is then exposed through a block-out mask and developed. The photoresist is plasma hardened in, for example CF$_4$/O$_2$ (about 8% O$_2$) for 30 seconds and baked at 180° C. for 30 minutes where the positive AZ1350J produced by the Shipley Company is used.

The next series of steps involves the critical reactive ion etching process for forming the depression in the base region in selective regions of the integrated circuit chip which allows for the controlled reproducible and narrow base width. The FIG. 1 structure is now placed in a suitable reactive ion or plasma etching environment for preferential etching of monocrystalline silicon in regions not masked by the silicon nitride and silicon dioxide. Any of the available plasma or reactive ion etching apparatus may be utilized, however, it is preferred to use a parallel plate reactive ion etcher, such as is described in The J. Lechaton, J. L. Mauer Proc. of the Symposium on Plasma Etching and Deposition, Electrochem Soc. Vol. 81-1, pages 75–85, 1981. The chamber of the etching apparatus is pumped down to a vacuum equal to or less than $5 \times 10^{-6}$ Torr. The reactive etching chamber is then backfilled with a gas mixture preferably of argon and chlorine with the chlorine being 3% to 7% of the argon, chlorine gas mixture. The resulting gas pressure is about 10 millitorr. Other gases such as SF$_6$/Cl/ He and CF$_4$ can be used in this process. The plasma is formed and the etching of silicon commences through the emitter mask opening and the collector reach-through mask opening until the desired depth of the depression is reached within the chamber of the reactive ion etcher. A silicon dioxide covered silicon wafer having a polycrystalline film on the silicon dioxide of the order of 300 nanometers of polycrystalline silicon is placed. A laser interferometer is positioned directly above this polycrystalline silicon film wafer. During the etching of the silicon wafers a constant readout is made by the laser interferometer to determine precisely when the desired depth of silicon etching has been reached. A preferred laser interferometer uses a He-Ne laser. One complete fringe using the He-Ne laser measured on the recorder for polycrystalline silicon is equivalent to 80 nanometer depth in the monocrystalline silicon. By pre-etching the polycrystalline silicon to a maximum or minimum in the fringe it is possible to repeatably etch exactly 80 nanometers in the silicon by etching for one fringe on the polycrystalline silicon monitor. At that point of desired etching the reactive ion etcher is turned off and etching ends. It is preferred that the etching depth range from 70 to 100 nanometers. It is undesirable to go more than 100 nanometers because of possibility of emitter-to-collector punch-through. The resulting structure is shown in FIG. 2 wherein the depression 30 in the base is shown and the depression 32 in the collector reach-through is given. It should be noted that the exposed silicon dioxide in the base contact regions have been slightly etched by about 14 nanometers during this reactive ion etching process.

The emitter is now formed using As capsule diffusion or ion implantation. The preferred diffusion process conditions are 1000° C. for 115±25 minutes. To achieve an emitter-base junction depth of 450 to 550 nanometers and base-collector junction, after this temperature cycle, of 800–850 nanometers. These conditions may be varied to produce the desired transistor structure. This processing results in a base width of about 300 nanometers. However, base widths of 100 to 400 nanometers can readily be fabricated by this process. FIG. 3 shows the result of this emitter process.

The formation of arsenic emitter by ion implantation is an alternative to the diffusion process. An illustrative process uses an implantation energy of 50 KeV with an implantation dosage of about $9.5 \times 10^{15}$. The screen silicon dioxide thickness used is typically 225 Å. The emitter drive-in heat cycle is about 73 minutes at 1000° C. This ion implantation process can be used to form the same junction depths described in regard to the diffusion process.

A suitable etchant is utilized to remove the remaining silicon dioxide from the base contact regions shown in FIG. 3. A wide variety of metal ohmic contacts may be utilized for this structure. However, there is shown as an example a platinum or palladium silicide ohmic contact 36 for each of the elements of the transistor.

This is formed by blanket depositing palladium or platinum metal over the bare silicon as well as the silicon nitride surfaces. The structure is heated to form either palladium or platinum silicide where the metal contacts the silicon. The unreacted metal is now removed by conventional etching. A blanket metal layer of transition metal, aluminum, aluminum-copper or the like, is deposited over the palladium or platinum silicide and the silicon nitride layer. Conventional lithography and etching techniques are used to delineate the blanket metal layer to form the base contacts 40, emitter contact 42 and collector contact 44 of the high performance transistor and base contacts 50, emitter contacts 52 and collector contact 54 for the lower performance transistor as shown in FIG. 4.

Figure 6:
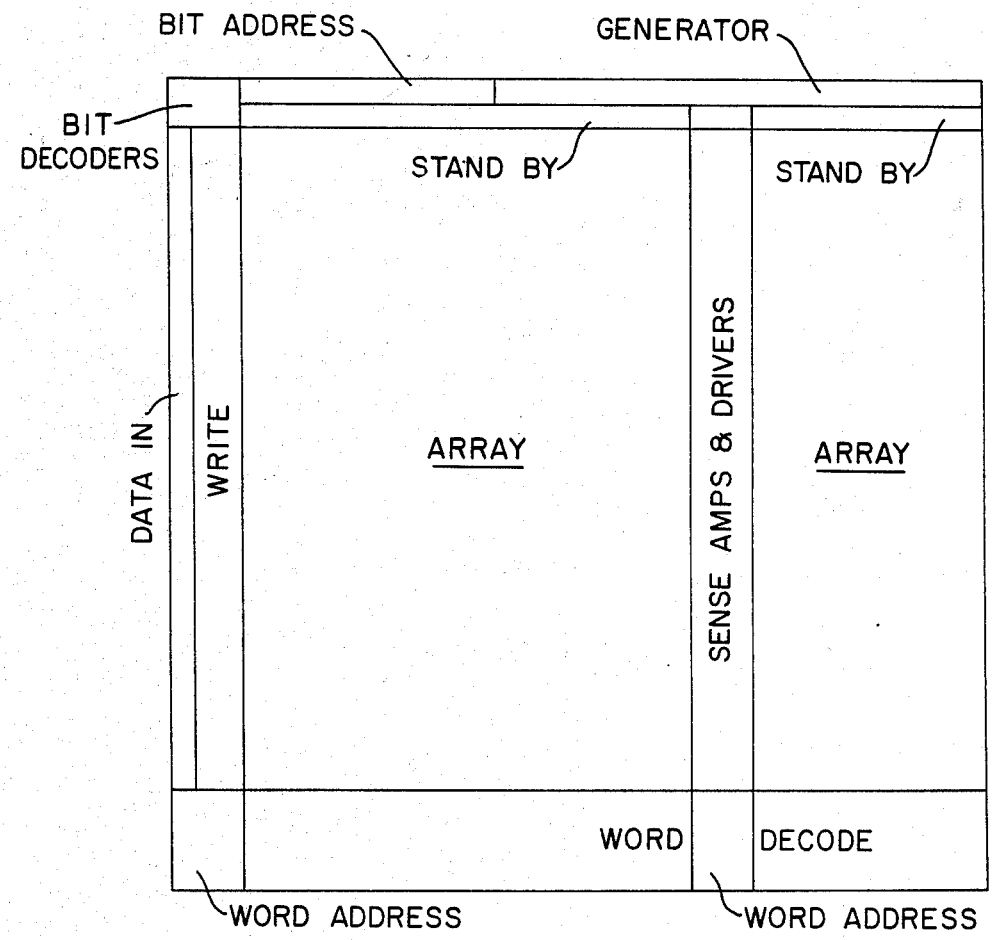
FIG. 6 schematically illustrates an integrated circuit chip layout for a memory array organized accordington to the principles of the present invention.

The applications of this multiple base width technology are illustrated in FIGS. 5 and 6. These are for illustration purposes only and should not be construed as all inclusive. Typical large scale integrated circuit chip consists of internal circuits and external or peripheral circuits. Such chips are usually for logic, memory or combinations of logic and memory applications.

FIG. 5 shows a typical integrated circuit chip layout for a logic array. The internal circuits consist of logic array cells in this example, whereas the externals consist of drivers, I/O cells and the regulators. The drivers may be, for example push-pull and/or emitter follower circuits. The I/O cells may include input stability, on-chip terminator, push-pull and bidirectional output and emitter follower output circuits.

FIG. 6 shows an integrated circuit chip layout for a random access memory. The internal circuits consist of the array of memory cells. The external circuits consist of the data-in, write, word decode, word address, bit address, generator, stand-by, sense amplifier and driver circuits.

The internal circuits are the main part of the circuitry in which logic functions in the FIG. 5 illustration and memory functions in the FIG. 6 example are carried out. As a consequence, it is desirable to have the transistors operate at high switching speeds and at low power. These internal circuits do not communicate directly off-chip, but through the external or peripheral circuits. The present concept allows these internal circuits to perform at faster speeds and higher current gain. The possible lowering of the breakdown voltage that accompanies narrowing the base width will not be a concern for these circuits as long as a certain minimum value is maintained. In addition, an array memory as shown in FIG. 6 will also benefit from this increased gain of the present concept, in that it will make the circuit more stable and will be able to have lower standby current.

The external or peripheral circuits perform the function of supporting the internal circuit requirements and moving information in the internal circuits to systems of the integrated circuit chip. Driver circuits are one type of such external circuits. The main function of these peripheral driver circuits is to send logic information to other integrated circuit chips. These circuits must communicate with the offchip receiver circuits in a very predictable fashion for given changes to the power supplies and temperature (delay equations). High current gain in this case results in changes in the D.C. wiring rules and increased voltage swings, both of which could impact design values adversly and thus provide a reduction in performance. Further, faster drivers may not be desirable since the current chip designs are mainly $\Delta I$ limited in the current packaging ($\Delta I$=off-chip capacitance×speed of state change). In addition, the drivers cannot have breakdown voltages less than power supply tolerance. For these reasons, the drivers are blocked off from the base etching which otherwise would result in higher speed, higher gain and lower breakdown voltage.

Another of the external circuits are receivers. The main function of the reciever circuit is to receive logic information from other integrated circuit chips. Since these circuits communicate with the off-chip drivers, the needs in terms of delay equation, $\Delta I$ noise cirteria, breakdown voltage, etc. are similar to those of the drivers. There is an additional requirement for the receiver circuits in terms of voltage stability, that is the input impedance must be positive. Therefore, it is desirable to block off the receiver circuit from base etching.

Regulators are other external circuits. The main function of the regulator circuits is to regulate the voltage and counteract the power changes as seen by the integrated circuit chip caused by changes in voltages and module distribution drops. It will also counteract the effect of temperature changes as seen by the chip. Since these circuits see the full voltage excursions (which can be many times the voltage of the internal circuits) as seen by the chip, the transistors should not be breakdown limited integrated circuit. For these reasons we should block off the regulators also from the base etching and therefore have bipolar transistors of slower operating speed and amplification characteristics than the internal circuits.

The memory integrated circuit chip sense amplifier and regulator external circuits are maintained blocked off from the base etching to assure high stability of operation. The driver circuits are susceptable to transistor breakdown due to punch-through so they are also blocked off from the base etching. The other external circuits do not require the high speed operation so they are also blocked off from base etching.

The speed of bipolar integrated circuits is related to transistor parameters, such as switching speed and current gain, as well as to external parameters, such as line capacitances, resistors and other impedance elements. Different circuit families respond differently to these parameters. All circuits are RC dominated. The question is whether the RC is external or internal to the transistors.

In transistor-transistor logic (TTL) circuits delay is primarily dictated by the line capacitance and the pull-up resistor and less by transistor parameters. A performance enhancement scheme for this type of circuit would typically consist of modifying external parameters. Therefore, the narrowed base width higher performance structure would only be of moderate improvement po performance.

However, emitter-coupled logic (ECL) circuits and Schottky current switch (SCS) circuits are very sensitive to changes in transistor parameters. This is because the external resistors and wiring capacitances are much smaller than the internal resistances and capacitances associated within the transistor for these "transistor-limited" circuits. Such circuits respond best to modifications in transistor parameters, such as base width. A complementary transistor switch (CTS) array cell also responds well to the selective basewidth technology. The cells become more stable and are capable of a lower stand-by current because of the increase $h_{FE}$ of the NPN transistor.

The circuits described in the preceeding paragraphs can be more fully understood by referring to "Integrated Circuit Engineering" by Arthur B. Glaser et al., published by Addison Wesley Publishing Co. in 1977, pages 618-645 for TTL circuits, pages 599-612 for ECL circuits and pages 613-617 for current switch emitter follower circuits. The CTS circuits are described in more detail in "A 1024 Byte ECL Random Access Memory Using a Complementary Transistor Switch (CTS) Cell" by J. Dorler et al. in IBM J. of R. and D., Vol. 25, Nos. 2 and 3, May 1981, pages 126-134.

While the invention has been particularly shown and described with reference to the preferred embodiments thereof, it will be understood by those skilled in the art that the foregoing and other changes in form and details may be made without departing from the spirit and scope of the invention.

What is claimed is:

1. A method for making an integrated circuit having two bipolar transistor types each having different operating speeds and amplification characteristics due to said transistor types being formed of different base widths, said method comprising:
providing a monocrystalline silicon substrate having a pattern of regions of said silicon isolated from one another by a dielectric pattern on one major surface of said substrate;
providing a subcollector region within said silicon and spaced from said major surface;
forming a base region in at least certain of said regions of silicon down to said subcollector region wherein said base region has a surface concentration of more than about $1 \times 10^{18}$ atoms/cm$^3$;
forming a block-out mask over said major surface in regions where said transistor type of lower said characteristics are desired;
subjecting in areas uncovered by said block-out mask the said base regions wherein an emitter region is planned to be formed to reactive ion etching to form a depression having a depth between about 70 to 100 nanometers;
removing said block-out mask;
forming an emitter region in said etched portion of said base regions and in unetched base regions which were in areas covered by said block-out mask and heating said emitter region wherein the intrinsic base regions are formed of different base widths; and
making electrical contact to each of the elements of said bipolar transistor types.

2. The method of claim 1 wherein the collector-base junction depth is between about 500 to 900 nanometers.

3. The method of claim 1 wherein the said base width for said etched transistors is between about 100 to 400 nanometers.

4. The method of claim 1 wherein the sides of said depression are substantially vertical without undercutting and the bottom of said depression is substantially planar from one vertical side to another vertical side.

5. The method of claim 1 wherein the depth of said depression is precisely monitored using a separate test wafer that has its silicon surface simultaneously etched while using laser light interferometer and the said etching is ended at the designated depth.

6. The method of claim 1 wherein the said reactive ion etching is accomplished using a mask composed layers of silicon dioxide and silicon nitride covering areas not desired to be etched.

7. The method of claim 6 wherein the said reactive ion etching ambient is argon and chlorine gas with a pressure less less than about 30 millitorr.

8. The method of claim 5 wherein said test wafer is composed of a silicon dioxide wafer having a polycrystalline silicon layer thereon and said laser is a He-Ne laser.

9. The method of claim 1 wherein said base doping is boron and said emitter doping is arsenic.

10. The method of claim 1 wherein said emitterbase junction depth is between about 350 nanometers to 500 nanometers.

11. A method for making an integrated circuit having two bipolar transistor types each type having different base widths, said method comprising:
providing a monocrystalline silicon substrate having a pattern of regions of said silicon isolated from one another by a dielectric pattern on one major surface of said substrate;
providing a subcollector region within said silicon and spaced from said major surface;
forming a base region in atleast certain of said regions of silicon down to said subcollector region wherein said base region has a surface concentration of more than about $1 \times 10^{18}$ atoms/cm$^3$;
selectively etching certain of said base regions in areas where an emitter region is planned to form a depression having a depth between 70 to 100 nanometers, while leaving the remaining of said base regions intact;
forming an emitter region in said etched portion of said base regions and in the base regions which were left intact and heating said emitter region wherein the intrinsic base regions are formed of different base widths; and
making electrical contact to each of the elements of said bipolar transistor types.

12. The method of claim 11 wherein the collector-base junction depth is between about 500 to 900 nanometers.

13. The method of claim 11 wherein the said base width for said etched transistors is between about 100 to 400 nanometers.

14. The method of claim 11 wherein said emitter base junction depth is between about 350 to 500 nanometers.

15. The method of claim 11 wherein said selective etching is accomplished by reactive ion etching using a mask covering areas not desired to be etched.

* * * * *